(12) United States Patent
Willie et al.

(10) Patent No.: US 9,609,738 B1
(45) Date of Patent: Mar. 28, 2017

(54) GRAPHITE SHEET TO REDIRECT SMT COMPONENTS DURING THERMAL EXPOSURE

(71) Applicant: Flextronics AP, LLC, Broomfield, CO (US)

(72) Inventors: Dennis Willie, San Jose, CA (US); Richard Loi, San Jose, CA (US); David Geiger, Dublin, CA (US); Anwar Mohammed, San Jose, CA (US); Murad Kurwa, San Jose, CA (US); Hector Rene Marin Hernandez, Lomas De Los Pajaros (MX)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/560,807

(22) Filed: Dec. 4, 2014

Related U.S. Application Data

(60) Provisional application No. 61/920,418, filed on Dec. 23, 2013.

(51) Int. Cl.
*H05K 1/02* (2006.01)
*H05K 1/18* (2006.01)
*H05K 1/11* (2006.01)
*H05K 7/20* (2006.01)

(52) U.S. Cl.
CPC ......... *H05K 1/0201* (2013.01); *H05K 1/0204* (2013.01); *H05K 1/115* (2013.01); *H05K 1/181* (2013.01); *H05K 7/2039* (2013.01); H05K 2201/0323 (2013.01); H05K 2201/062 (2013.01)

(58) Field of Classification Search
CPC ......... H05K 1/201; H05K 1/203; H05K 1/209
See application file for complete search history.

(56) References Cited

U.S. PATENT DOCUMENTS

| | | | |
|---|---|---|---|
| 3,652,075 A | 3/1972 | Thompson | |
| 4,541,035 A * | 9/1985 | Carlson | H01L 23/147 174/257 |
| 5,203,489 A | 4/1993 | Gileta et al. | |
| 5,240,169 A | 8/1993 | Gileta et al. | |
| 5,617,990 A | 4/1997 | Thompson, Sr. | |
| 6,142,357 A | 11/2000 | Howell | |
| 6,145,729 A | 11/2000 | Thompson, Sr. | |
| 6,164,633 A | 12/2000 | Mulligan et al. | |
| 6,257,329 B1 | 7/2001 | Balzano | |
| 6,866,182 B2 | 3/2005 | Wong et al. | |
| 7,182,793 B2 | 2/2007 | Duan et al. | |
| 7,614,538 B2 | 11/2009 | Gillotti et al. | |
| 7,975,899 B2 | 7/2011 | Jindo et al. | |

(Continued)

*Primary Examiner* — Jeremy C Norris
(74) *Attorney, Agent, or Firm* — Haverstock & Owens LLP

(57) ABSTRACT

A formed graphite sheet is shaped and sized as a protective shield positioned over an electronic component coupled to a PCB. The formed graphite sheet is used to protect a body of the electronic component from heat applied during the assembly of the electronic component to the PCB, such as the heating steps used in SMT and through-hole technology. The formed graphite sheet is shaped to selective direct impinging heat. The heat can be directly away from the entire electronic component. Alternatively, the heat can be selectively directed away from some portions of the electronic component and toward other portions of the electronic component.

19 Claims, 6 Drawing Sheets

(56) References Cited

U.S. PATENT DOCUMENTS

| | | |
|---|---|---|
| 8,752,751 B2 | 6/2014 | Chuang et al. |
| 2002/0131237 A1 | 9/2002 | Snyder |
| 2005/0006435 A1 | 1/2005 | Diehm et al. |
| 2005/0067463 A1 | 3/2005 | Wang et al. |
| 2005/0284656 A1 | 12/2005 | Shimada et al. |
| 2006/0044762 A1 | 3/2006 | Kikuchi |
| 2006/0086484 A1 | 4/2006 | Hegde |
| 2006/0102703 A1 | 5/2006 | Akhtar et al. |
| 2006/0226201 A1 | 10/2006 | Reed |
| 2007/0064399 A1 | 3/2007 | Mandel |
| 2007/0218284 A1* | 9/2007 | Wu .............................. 428/408 |
| 2007/0230132 A1 | 10/2007 | Lee |
| 2008/0101026 A1 | 5/2008 | Ali |
| 2008/0142568 A1 | 6/2008 | Reed |
| 2008/0144287 A1 | 6/2008 | Shigaki |
| 2008/0171402 A1 | 7/2008 | Karnezos |
| 2008/0218977 A1 | 9/2008 | Reis |
| 2008/0310114 A1 | 12/2008 | Pawlenko |
| 2009/0020593 A1 | 1/2009 | Kinoshita et al. |
| 2009/0086439 A1 | 4/2009 | Whitton |
| 2009/0095461 A1 | 4/2009 | Lemak |
| 2009/0183190 A1 | 7/2009 | Fukuda et al. |
| 2009/0279218 A1 | 11/2009 | Ferru |
| 2009/0309215 A1 | 12/2009 | Kitabatake |
| 2010/0078413 A1 | 4/2010 | Hosokawa et al. |
| 2010/0079953 A1 | 4/2010 | Okutsu |
| 2010/0085713 A1 | 4/2010 | Balandin |
| 2010/0157544 A1 | 6/2010 | Tsao |
| 2010/0309631 A1 | 12/2010 | Hill |
| 2010/0315783 A1 | 12/2010 | Lemak |
| 2011/0031297 A1 | 2/2011 | Nakaya et al. |
| 2011/0051369 A1 | 3/2011 | Takahara |
| 2011/0299248 A1 | 12/2011 | Liu |
| 2012/0020023 A1 | 1/2012 | Nemesh |
| 2012/0049347 A1* | 3/2012 | Wang .............................. 257/737 |
| 2012/0050997 A1 | 3/2012 | Chen |
| 2012/0314374 A1 | 12/2012 | Elkaslassy |
| 2013/0020379 A1 | 1/2013 | Kim |

* cited by examiner

GRAPHITE SHEET TO REDIRECT SMT COMPONENTS DURING THERMAL EXPOSURE

RELATED APPLICATIONS

This Patent Application claims priority under 35 U.S.C. 119(e) of the U.S. provisional patent application, Application No. 61/920,418, filed on Dec. 23, 2013, and entitled "GRAPHITE SHEET TO PROTECT SMT COMPONENTS FROM THERMAL EXPOSURE", which is hereby incorporated in its entirety by reference.

FIELD OF THE INVENTION

The present invention is generally directed to surface mounted components. More specifically, the present invention is directed to a graphite sheet for protecting surface mount components from thermal exposure.

BACKGROUND OF THE INVENTION

Surface-mount technology (SMT) is a manufacturing method for mounting an active or passive electronic component, such as a resistor, capacitor, inductor or semiconductor chip, onto the surface of a printed circuit board (PCB). The electronic component has leads or contacts, herein collectively referred to as leads, used to interconnect with corresponding contact points, such as solder pads, on the PCB. Examples of such leads include, but are not limited to, short pins or leads of various styles, flat contacts, a matrix of solder balls, or terminations on the body of the component.

To mechanically and electrically attach the electronic component to the PCB, solder paste is first applied to the solder pads on the PCB. A pick and place machine then places the electronic component on the PCB such that the leads of the electronic component are aligned and in contact with the corresponding solder pads on the PCB. The PCB is then conveyed into a reflow soldering oven where the temperature is high enough to melt the solder paste, bonding the leads of the electronic component to the solder pads on the PCB.

Through-hole technology is another manufacturing method for mounting an electronic component on a PCB. Leads of the electronic component are inserted into holes drilled through the PCB and soldered to pads on the opposite side. A wave soldering process is used to apply the solder. The wave soldering process includes a preheating step that heats the PCB.

Heating the PCB during the solder reflow step or the preheating step subjects the electronic component to thermal heat exposure. Some electronic components, such as aluminum electrolytic capacitors, are highly sensitive to thermal heat exposure. For such electronic components, the temperature needed to bond the leads to the PCB exceeds the temperature that results in damage to the body of the electronic components. In the case where the electronic component is an aluminum electrolytic capacitor, for example, the capacitor body must stay below 200 degrees Celsius while the leads must be above 230 degrees Celsius for a minimum of 30 seconds to perform the solder paste reflow process.

Existing material properties and/or combinations provide limited thermal protection to the electronic component. Using different materials and shapes has proven to be extremely challenging to find the best combination and design to achieve the thermal targets required.

SUMMARY OF THE INVENTION

A formed graphite sheet is shaped and sized as a protective shield positioned over an electronic component coupled to a PCB. The formed graphite sheet is used to protect a body of the electronic component from heat applied during the assembly of the electronic component to the PCB, such as the heating steps used in SMT and through-hole technology. The formed graphite sheet is shaped to selective direct impinging heat. The heat can be directly away from the entire electronic component. Alternatively, the heat can be selectively directed away from some portions of the electronic component and toward other portions of the electronic component.

In an aspect, a heat shielding system is disclosed which includes a substrate, an electronic component and a formed graphite sheet. The substrate has a first surface. The electronic component has a body and one or more electronic leads extending from the body, wherein the electronic component is coupled to the substrate. The formed graphite sheet is positioned over the electronic component and coupled to the first surface of the substrate. The formed graphite sheet is configured to shield the body of the electronic component from externally applied heat and to selectively direct heat impinging the formed graphite sheet.

In some embodiments, the formed graphite sheet further includes one or more extensions extending away from an interior of the formed graphite sheet. In some embodiments, the one or more extensions are configured to direct heat away from the interior of the formed graphite sheet. In some embodiments, the one or more extensions include fins, flags, barbs or any combination thereof. In some embodiments, the one or more extensions extend from a bottom portion of the formed graphite sheet. In some embodiments, the one or more extensions are coupled to an external heat sink. In some embodiments, the formed graphite sheet is configured to selectively direct heat away from the body of the electronic component and toward the one or more electronic leads of the electronic component. In some embodiments, the formed graphite sheet includes stacked layers and heat moves laterally within each layer, wherein the bottom surface of the formed graphite sheet is formed by ends of the stacked layers such that heat is directed to the ends of the stacked layers. In some embodiments, the formed graphite sheet includes a top surface configured to cover the electronic component and a bottom surface surrounding an opening through which the electronic component fits. In some embodiments, the bottom surface of the formed graphite sheet is positioned against the first surface of the substrate such that the electronic component fits within the formed graphite sheet. In some embodiments, the electronic component is coupled to the printed circuit board using through-hole technology. In some embodiments, the formed graphite sheet also includes a plurality of standoffs coupled to the bottom surface, wherein the plurality of standoffs are positioned against the first surface of the substrate such that the body of the electronic component fits within the formed graphite sheet and there is a separation between the bottom surface of the formed graphite sheet and the first surface of the substrate. In some embodiments, the electronic component is coupled to the substrate using surface mount technology. In some embodiments, the bottom surface forms an uninterrupted perimeter around the opening. In some embodiments, the formed graphite sheet also includes one or more cut outs formed in the bottom surface such that within each cut out there is a separation between the formed graphite sheet and the first surface of the substrate. In some embodiments, the substrate is a printed circuit board. In some embodiments, the electronic component is coupled to the printed circuit board using surface mount technology. In other embodiments, the electronic component is coupled to the printed circuit board using through-hole technology. In some embodiments, the formed graphite sheet is a graphite cap.

In another aspect, a heat shielding system is disclosed that includes a printed circuit board, an electronic component and a graphite cap. The printed circuit board has a first surface. The electronic component has a body and one or more electronic leads extending from the body, wherein the electronic component is mounted to the first surface of the printed circuit board. The graphite cap is positioned over the electronic component and coupled to the first surface of the printed circuit board. The graphite cap includes a top surface configured to cover the electronic component and a bottom surface surrounding an opening through which the electronic component fits. The graphite cap is configured to shield the body of the electronic component from externally applied heat and to selectively direct heat impinging the formed graphite sheet.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to a formed graphite sheet. Those of ordinary skill in the art will realize that the following detailed description of the formed graphite sheet is illustrative only and is not intended to be in any way limiting. Other embodiments of the formed graphite sheet will readily suggest themselves to such skilled persons having the benefit of this disclosure.

Reference will now be made in detail to implementations of the formed graphite sheet as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Embodiments are directed to a formed graphite sheet that is shaped and sized as a protective shield positioned over an electronic component coupled to a PCB. The formed graphite sheet is used to protect a body of the electronic component from heat applied during the assembly of the electronic component to the PCB, such as the heating steps used in SMT and through-hole technology.

Figure 1:
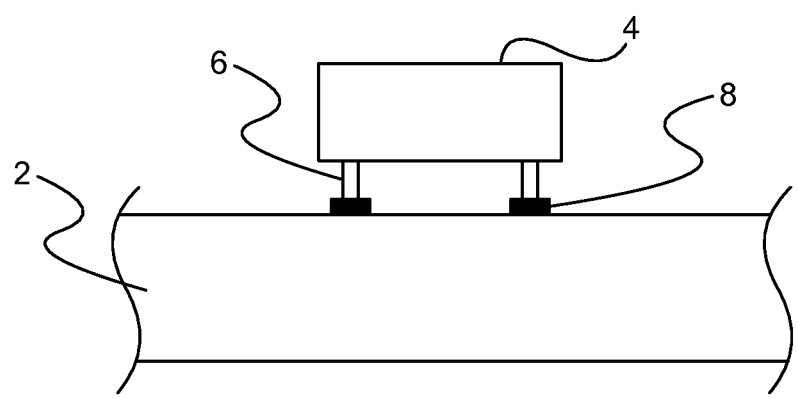
FIG. 1 illustrates an electronic component coupled to a PCB according to an embodiment.
Figure 2:
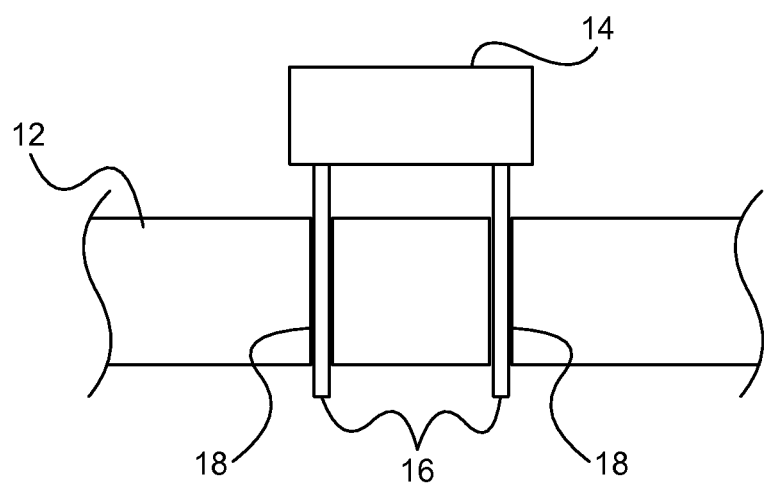
FIG. 2 illustrates an electronic component coupled to a PCB according to another embodiment.

Mechanical and electrical connection between the electronic component and the PCB are established by soldering the leads of the electronic component to the PCB. FIG. 1 illustrates an electronic component 4 coupled to a PCB 2 according to an embodiment. In this exemplary configuration, the electronic component 4 is mounted onto the surface of the PCB 2 using SMT. The electronic component 4 includes leads 6 each of which is coupled to a corresponding contact pad 8 on the PCB 2. FIG. 2 illustrates an electronic component 14 coupled to a PCB 12 according to another embodiment. In this exemplary configuration, the electronic component 14 is mounted to the PCB 12 using through hole technology. The electronic component 14 includes leads 16 each of which is positioned through a corresponding through hole 18 in the PCB 12. In either the configuration of FIG. 1 or FIG. 2, the leads of the electronic component are soldered to the PCB using a heating step. As such, the leads need to be exposed to sufficient temperature to melt the solder. In the case where the electronic component is sensitive to thermal heat exposure, there is a need to expose the body of the electronic component to a lower temperature than the leads.

A technique for exposing the body of the electronic component to a lower temperature than the leads is to shield the body using a fitted cap. Metals generally have good thermal conductivities and isotropic conductivities where heat is equally conducted in all three axes, X, Y and Z. For example, copper has a thermal conductivity of about 400 W/mK and aluminum has a thermal conductivity of about 200 W/mK.

A graphite sheet has a layered, planar structure having an anisotropic heat dissipating property. The thermal conductivity of the graphite sheet is very high (700-1900 W/mk)

along its layered structure (X-Y plane), but low (1.7 W/mk) in a direction perpendicular to the layered structure (Z-axis). If a graphite sheet is used as a heat spreader, the heat is predominately conducted along the X-Y plane exposed to the heat source due to its low thermal conductivity in the direction along the Z-axis.

Figure 3:
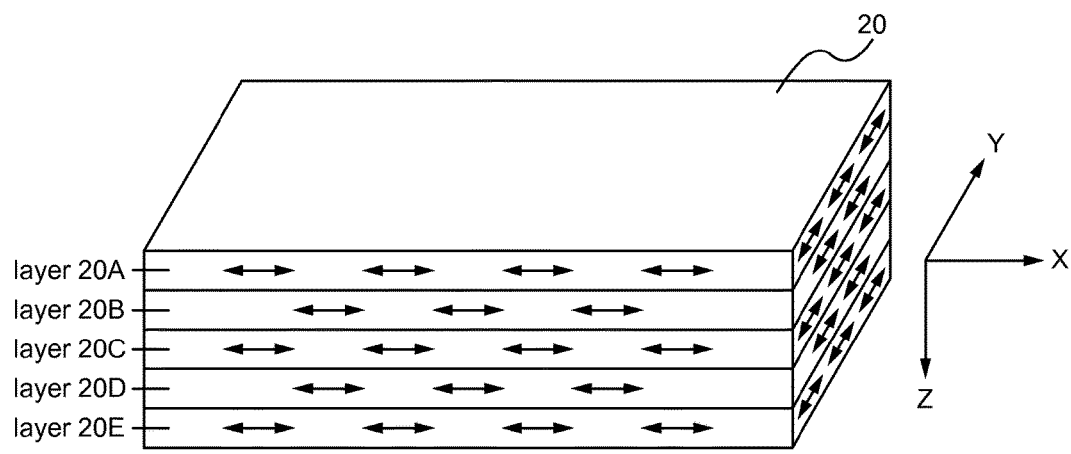
FIG. 3 illustrates a graphite sheet according to an embodiment.

FIG. 3 illustrates a graphite sheet according to an embodiment. In the exemplary configuration shown in FIG. 3, the graphite sheet 20 includes multiple layers 20A, 20B, 20C, 20D and 20E. It is understood that the graphite sheet can have more or less layers than that shown in FIG. 3. The graphite sheet has a higher thermal conductivity in the X-Y plane of each layer than in the direction of the Z-axis connecting layers and as such the graphite sheet 20 has an isotropic heat dissipating property.

Figures 4A, 4B:
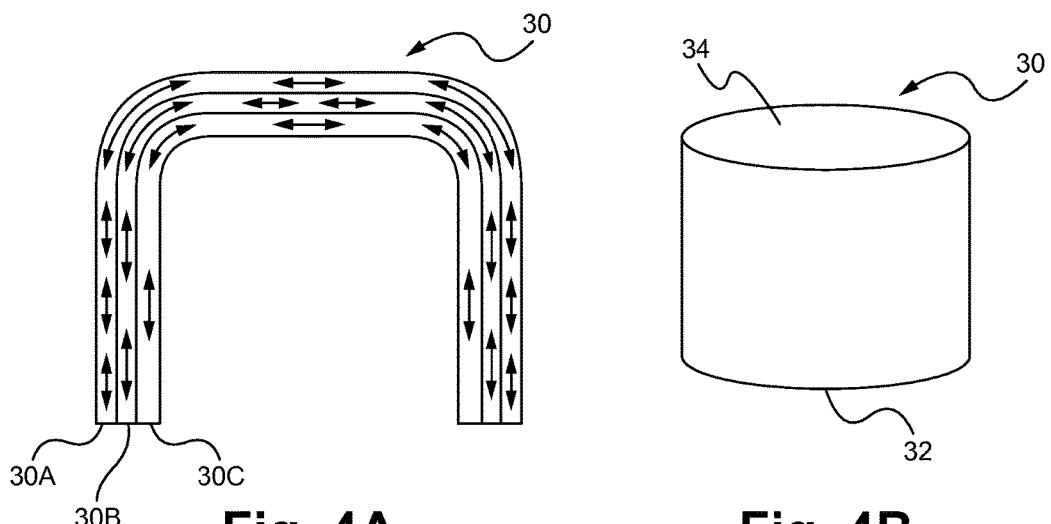
FIG. 4A illustrates a cut out side view of a formed graphite sheet according to an embodiment.
FIG. 4B illustrates a top down perspective view of the formed graphite sheet of FIG. 4A.

A graphite sheet can be formed into various sizes and shapes. FIG. 4A illustrates a cut out side view of a formed graphite sheet according to an embodiment. The formed graphite sheet in FIG. 4A is formed as a graphite cap 30 that provides a covering on the top and an opening on the bottom. FIG. 4B illustrates a top down perspective view of the formed graphite sheet of FIG. 4A. The graphite cap 30 includes a top surface 34 that provides a covering and an annular bottom surface 32 that includes an opening. As shown in FIG. 4A, the graphite cap 30 includes layers 30A, 30B and 30C. The number of layers shown is for exemplary purposes only. When shaped, the layers of the formed graphite sheet conduct heat along the contour of the cap, for simplicity still referred to as the X-Y plane of the graphite sheet. This enables heat impinging the graphite cap at its outer layer, e.g. layer 30A, to be conducted along the outer contour of the graphite cap while minimizing heat penetration from one layer to the next layer, substantially shielding the interior of the graphite cap from the impinging heat and thereby reducing the amount of heat experienced within.

Figure 5:
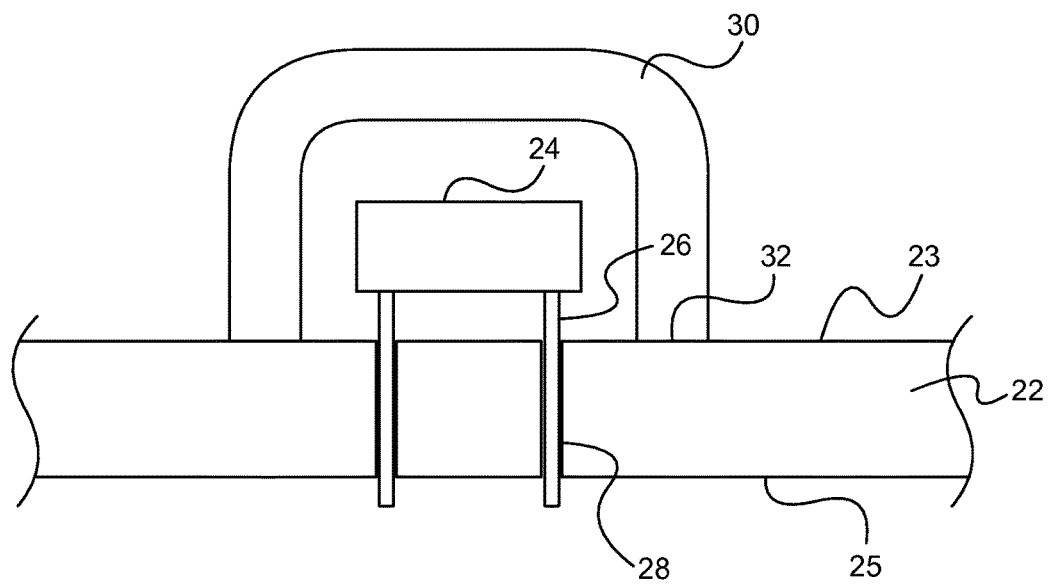
FIG. 5 illustrates an exemplary application where the graphite cap is formed to fit over the electronic component mounted to the PCB using through hole technology.

In some embodiments, the formed graphite sheet is shaped to substantially match the shape of a corresponding electronic component, and sized slightly larger than the electronic component so that the formed graphite sheet fits over the electronic component, as shown in FIG. 5. In the case where the electronic component is a circular shaped capacitor, the formed graphite sheet is shaped having a circular cross section having a diameter slightly larger than a diameter of the capacitor. It is understood that in general the formed graphite sheet can be shaped to tightly or loosely match the form factor of the electronic component. FIG. 5 illustrates an exemplary application where the graphite cap is formed to fit over the electronic component 24 mounted to the PCB 22 using through hole technology. In this case, the portion of the leads 26 subject to soldering are exposed on the bottom surface 25 of the PCB 22 and it is less critical that the portion of the leads 26 at the top surface 23 of the PCB 22 are exposed to the same amount of heat as that portion at the bottom surface 25 of the PCB 22. As such, the graphite cap 30 can be configured such that the bottom surface 32 rests on the top surface 23 of the PCB 22.

Figure 6A:
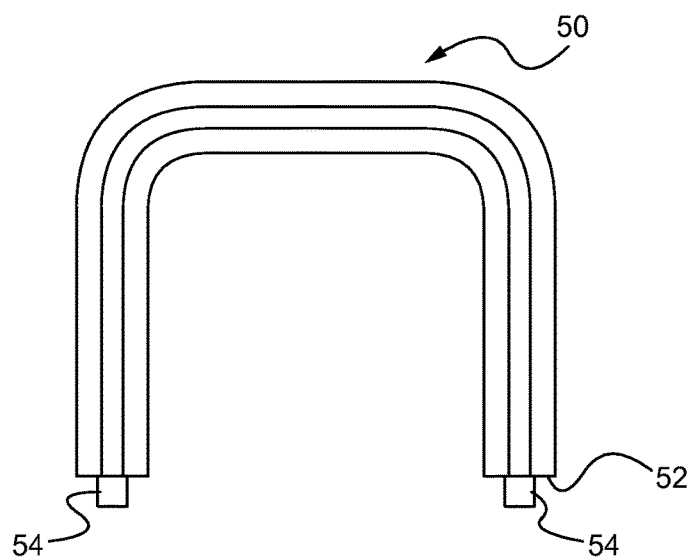
FIG. 6A illustrates a cut out side view of a formed graphite sheet according to another embodiment.
Figure 6B:
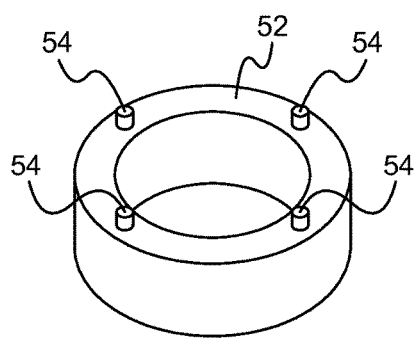
FIG. 6B illustrates a bottom up perspective view of the graphite cap of FIG. 6A.
Figure 7:
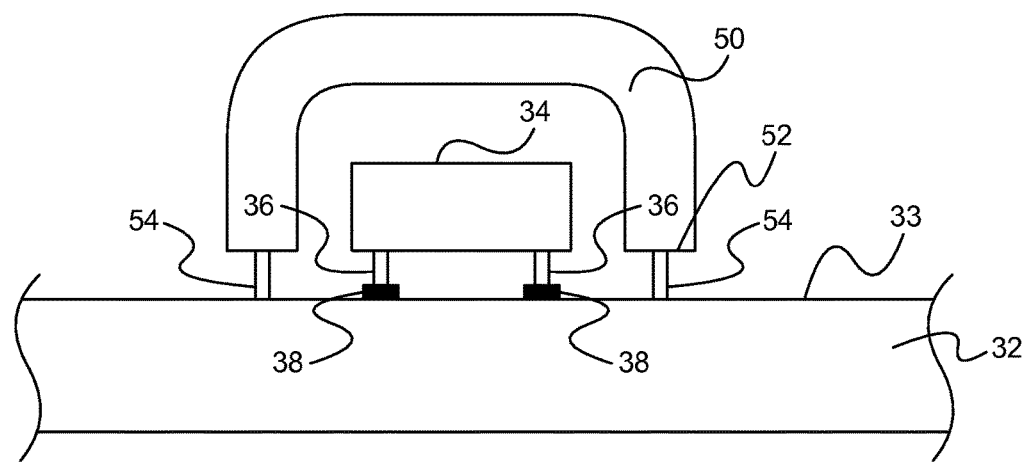
FIG. 7 illustrates an exemplary application where the graphite cap is formed to fit over the electronic component mounted to the PCB using SMT.

In some applications, it is desirable to allow heat to access the electronic component leads on the top surface of the PCB, such as in the case of an electronic component mounted using SMT. FIG. 6A illustrates a cut out side view of a formed graphite sheet according to another embodiment. The graphite sheet in FIG. 6A is formed as a graphite cap 50 which is similar to that of the graphite cap 30 in FIG. 4A with the addition of standoffs 54 extending from a bottom surface 52 of the graphite cap 50. FIG. 6B illustrates a bottom up perspective view of the graphite cap 50 of FIG. 6A. The standoffs 54 provide support for the graphite cap 50 but enable heat to access leads 36 of the electronic component 34, as shown in FIG. 7. FIG. 7 illustrates an exemplary application where the graphite cap is formed to fit over the electronic component 34 mounted to the PCB 32 using SMT. It is necessary to provide sufficient heat to the leads 36 to enable the soldering process. In this case, heat is provided access to the leads 36 by using the standoffs 54 to provide separation between the top surface 33 of the PCB 32 and the bottom surface 52 of the graphite cap 50. While heat is provided access to the leads 36, the body of the electronic component 34 is still provided heat shielding by the layers of the graphite cap 50.

In some embodiments, the formed graphite sheet is configured not only to shield the body of the electronic component from excessive heat, but the configuration of the formed graphite sheet can be such that heat is directed, or routed, in particular directions. This concept can be used to remove heat from the entire electronic component, or to regulate the heat at different portions of the electronic component, such as the body versus the leads. Since heat moves laterally within each layer, in some embodiments the formed graphite sheet directs heat to the lateral edges of the sheet. For example, in the graphite cap configurations shown in FIG. 4A or 6A, heat is directed toward the bottom surface 32 or 52, respectively, where the heat can be radiated away from the graphite sheet, in these cases toward the PCB.

Figure 8A:
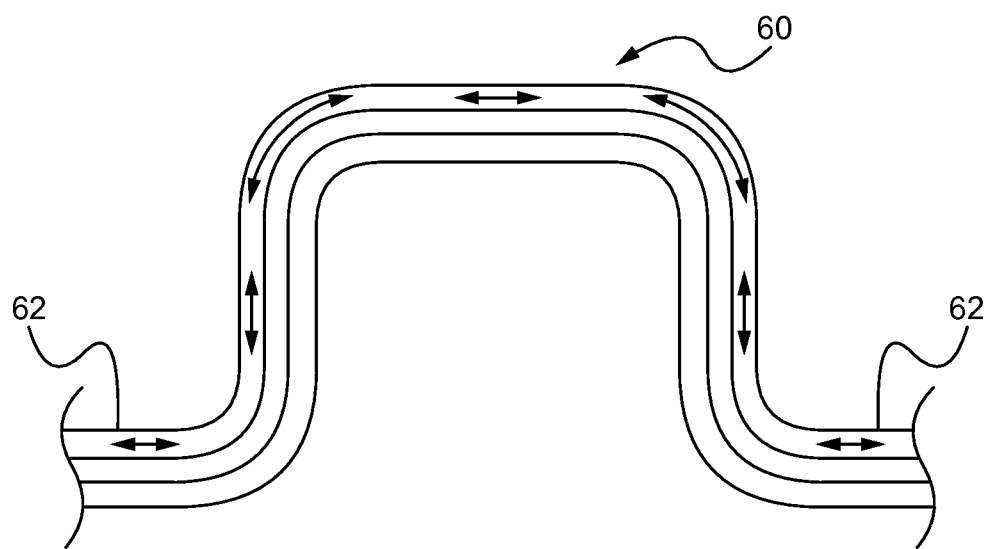
FIG. 8A illustrates a cut out side view of a formed graphite sheet configured for alternatively directing heat according to an embodiment.
Figure 8B:
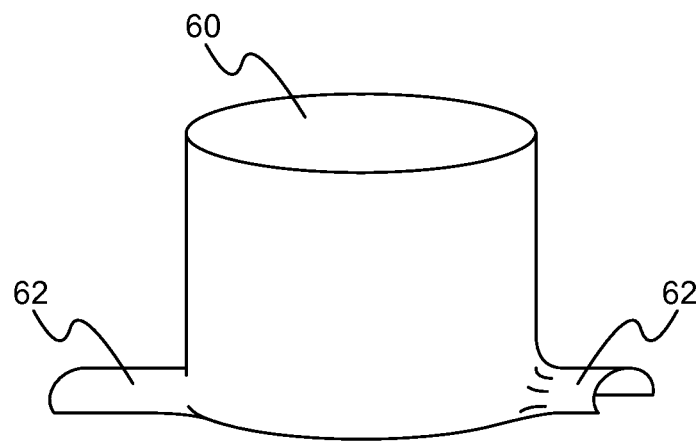
FIG. 8B illustrates a top down perspective view of the graphite cap of FIG. 8A.

Alternative configurations are also contemplated so as to alternatively direct heat using the formed graphite sheet. FIG. 8A illustrates a cut out side view of a formed graphite sheet configured for alternatively directing heat according to an embodiment. The graphite sheet in FIG. 8A is formed as a graphite cap 60 which is similar to that of the graphite cap 30 in FIG. 4A but with fins 62 formed at portions of the graphite sheet ends. FIG. 8B illustrates a top down perspective view of the graphite cap 60 of FIG. 8A. The fins 62 extend laterally and can therefore radiate heat laterally along the surface of a coupled PCB. In some embodiments, the fins 62 are coupled to heat sinks or heat rejectors, or thermally tied to a PCB connection or PCB surface. The formed graphite sheet can have alternative forms of extensions other than fins, such as flags, barbs, heat sinks or the like, that function to draw heat away from the body of the electronic component.

Figure 9:
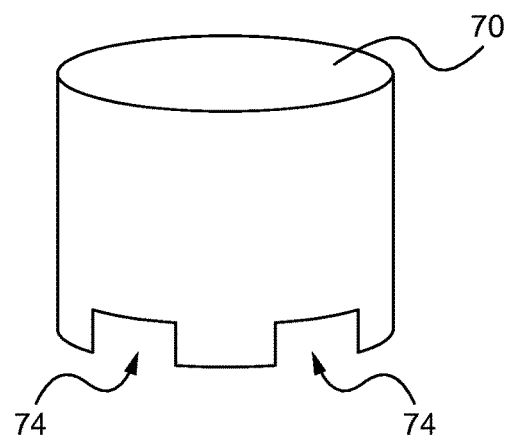
FIG. 9 illustrates a top down perspective view of a formed graphite sheet configured for alternatively directing heat according to another embodiment.

Still other configurations are also contemplated so as to alternatively direct heat using the formed graphite sheet. FIG. 9 illustrates a top down perspective view of a formed graphite sheet configured for alternatively directing heat according to another embodiment. The graphite sheet in FIG. 9 is formed as a graphite cap 70 which is similar to that of the graphite cap 30 in FIG. 4A but with cut outs 74 formed at the bottom surface, or ends, of the graphite sheet. The cut outs 74 enable more heat to access the leads than the body of the electronic component. Any number of cut outs can be formed, in any shape. The cut outs can be uniformly or non-uniformly shaped and positioned.

Figure 10:
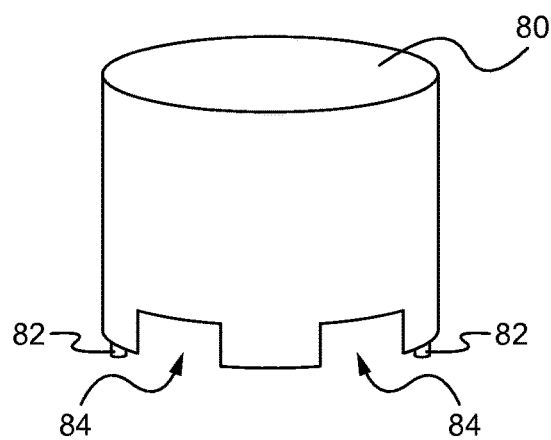
FIG. 10 illustrates an exemplary graphite cap having standoffs and cut outs.
Figure 11:
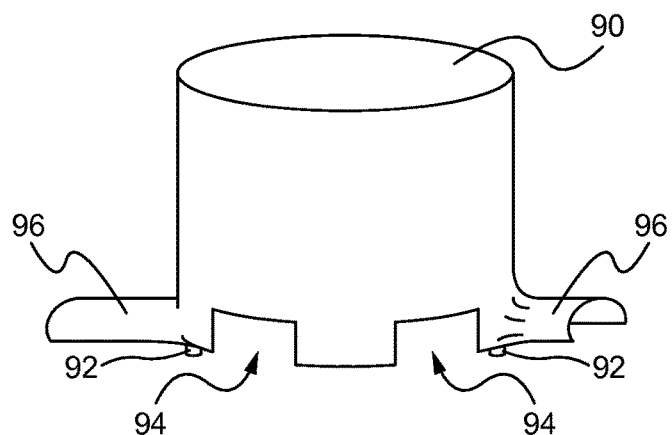
FIG. 11 illustrates an exemplary graphite cap having standoffs, fins and cut outs.

The various features such as standoffs, extensions and cut outs can be used in any combination. FIG. 10 illustrates an exemplary graphite cap 80 having standoffs 82 and cut outs 84. FIG. 11 illustrates an exemplary graphite cap 90 having standoffs 92, fins 96 and cut outs 94.

Heat impinging the formed graphite sheet can be rapidly distributed in the X-Y plane. In general, a formed graphite sheet can be used whenever there is a need to pull heat away from sensitive components. The formed graphite sheet can also be used for any type of heat protection or heat sinking application where temperatures on different portions of an electronic component need to be kept at different levels.

Proper configuration of the formed graphite sheet enables heat to be transferred away from where it is not wanted and to somewhere else where the heat may be more useful by taking advantage of the heat conductivity in the X-Y plane and anti-conductivity in the Z-direction, where the Z-direction corresponds to the thickness of the graphite sheet. Depending on the shape and configuration of the formed graphite sheet, heat moves laterally along the sheet, but only minimally through the sheet. The size and shape of the formed graphite sheet can be modified depending on how much heat needs to be removed and to where the heat can be directed. Heat can be either transferred away form the entire electronic component, or away from portions of the electronic component, such as the body, and toward other portions, such as the leads.

In some embodiments, the formed graphite sheets are temporarily placed over the electronic component during the mounting process. The formed graphite sheet can be placed manually or by using a pick and place machine.

The formed graphite sheets are described above as being used to cover a single electronic component. Alternatively, the formed graphite sheets can be shaped so as to cover two or more electronic components or other form factors as may be necessary to shield and direct heat as desired.

The present application has been described in terms of specific embodiments incorporating details to facilitate the understanding of the principles of construction and operation of the formed graphite sheet. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A heat shielding system comprising:
   a. a substrate having a first surface;
   b. an electronic component having a body and one or more electronic leads extending from the body, wherein the electronic component is coupled to the substrate; and
   c. a formed graphite sheet positioned over the electronic component and coupled to the first surface of the substrate, wherein the formed graphite sheet is configured to shield the body of the electronic component from externally applied heat and to selectively direct heat impinging the formed graphite sheet away from the body of the electronic component and toward the one or more electronic leads of the electronic component, further wherein the formed graphite sheet comprises stacked layers and heat moves laterally within each layer.

2. The heat shielding system of claim 1 wherein the formed graphite sheet further comprises one or more extensions extending away from an interior of the formed graphite sheet.

3. The heat shielding system of claim 2 wherein the one or more extensions are configured to direct heat away from the interior of the formed graphite sheet.

4. The heat shielding system of claim 2 wherein the one or more extensions comprise fins, flags, barbs or any combination thereof.

5. The heat shielding system of claim 2 wherein the one or more extensions extend from a bottom portion of the formed graphite sheet.

6. The heat shielding system of claim 2 wherein the one or more extensions are coupled to an external heat sink.

7. The heat shielding system of claim 1 wherein the bottom surface of the formed graphite sheet is formed by ends of the stacked layers such that heat is directed to the ends of the stacked layers.

8. The heat shielding system of claim 1 wherein the formed graphite sheet comprises a top surface configured to cover the electronic component and a bottom surface surrounding an opening through which the electronic component fits.

9. The heat shielding system of claim 8 wherein the bottom surface of the formed graphite sheet is positioned against the first surface of the substrate such that the electronic component fits within the formed graphite sheet.

10. The heat shielding system of claim 9 wherein the electronic component is coupled to the printed circuit board using through-hole technology.

11. The heat shielding system of claim 8 wherein the formed graphite sheet further comprises a plurality of standoffs coupled to the bottom surface, further wherein the plurality of standoffs are positioned against the first surface of the substrate such that the body of the electronic component fits within the formed graphite sheet and there is a separation between the bottom surface of the formed graphite sheet and the first surface of the substrate.

12. The heat shielding system of claim 11 wherein the electronic component is coupled to the substrate using surface mount technology.

13. The heat shielding system of claim 8 wherein the bottom surface forms an uninterrupted perimeter around the opening.

14. The heat shielding system of claim 1 wherein the substrate comprises a printed circuit board.

15. The heat shielding system of claim 14 wherein the electronic component is coupled to the printed circuit board using surface mount technology.

16. The heat shielding system of claim 14 wherein the electronic component is coupled to the printed circuit board using through-hole technology.

17. The heat shielding system of claim 1 wherein the formed graphite sheet comprises a graphite cap.

18. The heat shielding system of claim 1 wherein the graphite sheet has an anisotropic heat dissipating property such that more heat is conducted laterally within each layer of the graphite sheet than between layers of the graphite sheet.

19. A heat shielding system comprising:
   a. a substrate having a first surface;
   b. an electronic component having a body and one or more electronic leads extending from the body, wherein the electronic component is coupled to the substrate; and
   c. a formed graphite sheet positioned over the electronic component and coupled to the first surface of the substrate, wherein the formed graphite sheet is configured to shield the body of the electronic component from externally applied heat and to selectively direct heat impinging the formed graphite sheet, further wherein the formed graphite sheet comprises a top surface configured to cover the electronic component and a bottom surface surrounding an opening through which the electronic component fits, wherein the formed graphite sheet further comprises one or more cut outs formed in the bottom surface such that within each cut out there is a separation between the formed graphite sheet and the first surface of the substrate.

* * * * *